(12) United States Patent
Hamada

(10) Patent No.: US 7,394,304 B2
(45) Date of Patent: Jul. 1, 2008

(54) SEMICONDUCTOR INTEGRATED CIRCUIT, ELECTRONIC DEVICE USING THE SAME, AND CONTROLLING METHOD OF SEMICONDUCTOR INTEGRATED CIRCUIT

(75) Inventor: Masao Hamada, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 134 days.

(21) Appl. No.: 11/406,397

(22) Filed: Apr. 19, 2006

(65) Prior Publication Data

US 2006/0244509 A1 Nov. 2, 2006

(30) Foreign Application Priority Data

Apr. 21, 2005 (JP) .............................. 2005-123222

(51) Int. Cl.
*H03H 3/01* (2006.01)
(52) U.S. Cl. .................. 327/524; 327/538; 327/534; 327/565; 326/37
(58) Field of Classification Search .................. 438/15, 438/109; 257/686, 723
See application file for complete search history.

(56) References Cited

U.S. PATENT DOCUMENTS 5,798,282 A * 8/1998 Bertin et al. .................. 438/15
5,946,545 A * 8/1999 Bertin et al. .................. 438/15
6,914,796 B1 * 7/2005 Zuckerstatter et al. ........ 365/51
7,262,492 B2 * 8/2007 Pieda et al. .................. 257/678

FOREIGN PATENT DOCUMENTS

JP          10-313091          11/1998

* cited by examiner

*Primary Examiner*—Vibol Tan
(74) *Attorney, Agent, or Firm*—Wenderoth, Lind & Ponack, L.L.P.

(57) ABSTRACT

A semiconductor integrated circuit comprises a logic circuit unit, a signal control unit, a first signal selecting unit to a third signal selecting unit, and a first element electrode to a fourth element electrode. A part of signal lines of the logic circuit unit is connectable to different element electrodes, in accordance with the operating state of the logic circuit unit. The signal control unit generates connection information related to the connection of the signal lines to the element electrodes, thereafter sending the connection information to an external LSI. The connection is made after a retaining period, during which the element electrode concerned is maintained at high impedance, thereby avoiding unexpected failure. According to the present structure, the number of element electrodes required by the semiconductor integrated circuit can be reduced.

15 Claims, 14 Drawing Sheets (1st semiconductor integrated circuit)

terminal arrangement:

operating state 1:

operating state 2:

operating state 3:

Fig. 9

(2nd semiconductor integrated circuit)

| terminal arrangement | T0 | T1 | T2 | T3 | T4 | T5 |

| operating state 1 | A0 | A1 | A2 | A3 | A4 | A5 | signal group A

| operating state 2 | C0 | C1 | C2 | D0 | D1 | D2 | signal group C   signal group D

| operating state 3 | A0 | A1 | A2 | A3 | A4 | A5 | signal group A

Fig. 10

(3rd semiconductor integrated circuit)

| terminal arrangement | T0 | T1 | T2 | T3 | T4 | T5 |

| operating state 1 | – | – | – | B0 | B1 | B2 | signal group B (B0, B1, B2)

| operating state 2 | D0 | D1 | D2 | B0 | B1 | B2 | signal group D (D0, D1, D2) — signal group B (B0, B1, B2)

| operating state 3 | – | – | – | D0 | D1 | D2 | signal group D

Fig. 11

| terminal arrangement | T0 | T1 | T2 | T3 | T4 | T5 | T6 | T7 | T8 | T9 | TA | TB |
|---|---|---|---|---|---|---|---|---|---|---|---|---|
| operating state 1 | A0 | A1 | A2 | A3 | A4 | A5 | B0 | B1 | B2 | – | – | – | signal group A ⸺ signal group B

| operating state 2 | C0 | C1 | C2 | | | | B0 | B1 | B2 | D0 | D1 | D2 |
|---|---|---|---|---|---|---|---|---|---|---|---|---| signal group C ⸺ signal group B ⸺ signal group D

| operating state 3 | A0 | A1 | A2 | A3 | A4 | A5 | | | | D0 | D1 | D2 |
|---|---|---|---|---|---|---|---|---|---|---|---|---| signal group A ⸺ signal group D

SEMICONDUCTOR INTEGRATED CIRCUIT, ELECTRONIC DEVICE USING THE SAME, AND CONTROLLING METHOD OF SEMICONDUCTOR INTEGRATED CIRCUIT

BACKGROUND OF THE INVENTION

1. Field of the Invention

The present invention relates to a semiconductor integrated circuit, especially to a packaged semiconductor integrated circuit in which connections between a logic circuit unit and semiconductor element electrodes are changeable according to an operating state of the logic circuit unit.

2. Description of the Related Art

In recent years, the degree of integration of a semiconductor integrated circuit has improved dramatically by evolution of the fine processing technology in semiconductor process, and the scale of the circuits contained by one semiconductor integrated circuit has become large. Consequently, a system LSI which realizes a great portion of functions of a system in one semiconductor integrated circuit has been used. Following the tendency, the number of the connection interfaces between the system LSI and a peripheral circuitry increases, and hence the number of the external terminals possessed by the system LSI also increases.

In the conventional semiconductor integrated circuit possessing a logic circuit unit therein, semiconductor element electrodes installed in a package and external terminals of the package are connected electrically for use in communication with external devices or circuitry, a power supply from the outside, and so on. The connection relationship of the semiconductor element electrodes and the signal lines which come out outside from the logic circuit unit in the package is usually fixed while the logic circuit unit is working. By way of exception, however, when testing the semiconductor integrated circuit, the connection relationship can be changed in an internal circuitry, and signals outputted to and inputted from the external terminals can be changed.

Moreover, a document 1 (Published Japanese patent application Hei 10-313091) discloses a technology which removes the restriction imposed by the location of external terminals at the time of mounting a packaged semiconductor integrated circuit on a board. In the technology disclosed by the document 1, a signal line, which comes out from the logic circuit unit in the package, is switched by a selection circuitry to connect to a different external terminal, thereby avoiding overlapped preparation of new external terminals which are required to reduce the restriction posed by the location of the external terminals.

However, as the degree of integration of a semiconductor integrated circuit advances, the area of the semiconductor element electrodes which connect the signal lines coming out from the logic circuit unit becomes large in comparison with the area of the logic circuit unit in the package, thereby hindering the area reduction of the semiconductor integrated circuit as a whole.

FIG. 14 is a layout drawing of the conventional packaged semiconductor integrated circuit. As shown in FIG. 14, in the conventional packaged semiconductor integrated circuit, a semiconductor element 3 is provided in a package 4, and external terminals composed of pads 5 and pins 6 are provided at the periphery of the package 4. The semiconductor element 3 possesses an internal logic circuit unit 1 and peripheral semiconductor element electrodes 2. The semiconductor element electrodes 2 connect with the signal lines (not shown) which come out from the logic circuit unit 1, and are further wire-bonded to the pads 5 when packaged. The area occupied by the logic circuit unit 1 is reduced with increasing degree of integration of the semiconductor integrated circuit; however, the area occupied by the semiconductor element electrodes 2 is not reduced. Consequently, a useless vacant area 7 arises in the semiconductor element 3.

Moreover, when more signal lines coming out from the logic circuit unit 1 are required as the logic circuit unit 1 is multi-functionalized in conjunction with higher integration of the semiconductor integrated circuit, a problem arises in the fact that the required number of the semiconductor element electrodes 2 is not securable, unless the area occupied by the semiconductor element electrodes 2 is increased.

OBJECTS AND SUMMARY OF THE INVENTION

In view of the above, an object of the present invention is to provide a semiconductor integrated circuit which enables change of connection between a packaged logic circuit unit and packaged semiconductor element electrodes, according to an operating state of the logic circuit unit, with accompanying reduction in the required number of semiconductor element electrodes, and its controlling method.

A first aspect of the present invention provides a semiconductor integrated circuit comprising: a logic circuit unit; a plurality of semiconductor element electrodes; a signal selecting unit operable to select a signal line among a plurality of signal lines externally extending from the logic circuit unit and to electrically connect the selected signal line to a first semiconductor element electrode among the plurality of semiconductor element electrodes; and a signal control unit operable to control the signal selecting unit. In accordance with change of an operating state of the logic circuit unit, the signal selecting unit connects electrically the selected signal line to a second semiconductor element electrode among the plurality of semiconductor element electrodes, the second semiconductor element electrode being different from the first semiconductor element electrode.

According to the structure, it is possible to change connection between the signal line coming out from the logic circuit unit and the semiconductor element electrodes, in response to change in operating state, i.e., change in contents of processing of the logic circuit unit. Consequently, a plurality of signal lines can share one semiconductor element electrode, and the required number of semiconductor element electrodes can be reduced. As further effect, the area of LSI incorporating the present semiconductor integrated circuit can be reduced.

A second aspect of the present invention provides the semiconductor integrated circuit as defined in the first aspect, wherein the signal control unit generates connection information relating to electrical connection of the plurality of signal lines to the plurality of semiconductor element electrodes. The electrical connection is made by the signal selecting unit in accordance with the change of the operating state of the logic circuit unit. The signal control unit sends the connection information to the signal selecting unit and, at the same time, to an external semiconductor integrated circuit as well.

According to the structure, use of connection information makes it possible to notify exactly the external semiconductor integrated circuit of the connection relationship between the semiconductor element electrodes and the signal lines coming out from the logic circuit unit.

A third aspect of the present invention provides the semiconductor integrated circuit as defined in the second aspect, wherein the signal selecting unit retains new electrical connection based on the connection information until a predetermined retaining period terminates after receiving the connection information from the signal control unit.

A fourth aspect of the present invention provides the semiconductor integrated circuit as defined in the third aspect, wherein the signal selecting unit maintains the second semiconductor element electrode at high impedance during the predetermined retaining period.

According to these structures, a retaining period is placed at the time of the change of connection between the signal line coming out from the logic circuit unit and the semiconductor element electrode, and the second semiconductor element electrode is maintained at high impedance during the retaining period; thereby potential failure accompanying the connection change can be avoided.

A fifth aspect of the present invention provides the semiconductor integrated circuit as defined in the second aspect, wherein the signal selecting unit comprises: a selector operable to make new electrical connection of one of the plurality of signal lines to one of the plurality of semiconductor element electrodes, based on the connection information; a state change detecting unit operable to detect the change of the operation state of the logic circuit unit, based on the connection information; a state transition protection unit operable to retain the new electrical connection to be made by the selector for a predetermined retaining period after the detection of the change of the operation state of the logic circuit unit by the state change detecting unit; and a counter unit operable to count the predetermined retaining period. When the counter unit finishes counting the predetermined retaining period, the state transition protection unit removes the retention of the new electrical connection to be made by the selector.

According to the structure, a certain retaining period is placed at the time of the change of connection between the signal line coming out from the logic circuit unit and the semiconductor element electrode, and the connection between the signal line and the semiconductor element electrode can be retained during the retaining period. The retaining period can be measured by the counter unit.

A sixth aspect of the present invention provides the semiconductor integrated circuit as defined in the fifth aspect, wherein the counter unit finishes counting the predetermined retaining period based on an internally preset reference value.

According to the structure, the reference value to be preset in the logic circuit unit is determined as sufficient time for the related external semiconductor integrated circuit to complete a setup accompanying the new connection information. Thereby, the semiconductor integrated circuit concerned can change certainly the connection between the signal line and the semiconductor element electrode.

A seventh aspect of the present invention provides the semiconductor integrated circuit as defined in the fifth aspect, wherein the signal selecting unit further comprises an acknowledgement receiving unit operable to receive an acknowledgement signal for the connection information from the external semiconductor integrated circuit to which the signal control unit sends the connection information, and wherein the counter unit finishes counting the predetermined retaining period based on the acknowledgement signal received by the acknowledgement receiving unit.

According to the structure, after receiving from the related external semiconductor integrated circuit the acknowledgement signal indicative of the completion of the setup accompanying the new connection information, the semiconductor integrated circuit concerned can change certainly the connection between the signal line and the semiconductor element electrode.

An eighth aspect of the present invention provides the semiconductor integrated circuit as defined in the fifth aspect, wherein the state transition protection unit maintains the second semiconductor element electrode at high impedance during the predetermined retaining period.

According to the structure, the new connection between the signal line coming out from the logic circuit unit and the second semiconductor element electrode can be made safely.

A ninth aspect of the present invention provides an electronic device comprising: a plurality of semiconductor integrated circuits connected mutually; and a board operable to mount the plurality of semiconductor integrated circuits thereon. At least one of the plurality of semiconductor integrated circuits comprises: a logic circuit unit; a plurality of semiconductor element electrodes; a signal selecting unit operable to select a signal line among a plurality of signal lines externally extending from the logic circuit unit and to electrically connect the selected signal line to a first semiconductor element electrode among the plurality of semiconductor element electrodes, the first semiconductor element electrode being selected in accordance with change of an operating state of the logic circuit unit; and a signal control unit operable to control the signal selecting unit and to generate connection information relating to the electrical connection made by the signal selecting unit, thereafter sending the connection information to the other semiconductor integrated circuits among the plurality of semiconductor integrated circuits. In the at least one of the plurality of semiconductor integrated circuits, in accordance with the change of the operating state of the logic circuit unit, the signal selecting unit connects electrically the selected signal line to a second semiconductor element electrode among the plurality of semiconductor element electrodes, the second semiconductor element electrode being different from the first semiconductor element electrode.

According to the structure, the electronic device concerned employs LSI incorporating the semiconductor integrated circuit which can change connection between the signal line coming out from the logic circuit unit and the semiconductor element electrode, in response to change in operating state, i.e., change in contents of processing of the logic circuit unit. Thereby, a smaller, highly integrated electronic device can be realized.

A tenth aspect of the present invention provides a controlling method of a semiconductor integrated circuit including a logic circuit unit and a plurality of semiconductor element electrodes, the controlling method comprising: selecting one of a plurality of signal lines externally extending from the logic circuit unit; performing a first electrical connection of the selected signal line to a first semiconductor element electrode among the plurality of semiconductor element electrodes; and performing a second electrical connection of the selected signal line to a second semiconductor element electrode among the plurality of semiconductor element electrodes, in accordance with change of an operating state of the logic circuit unit, the second semiconductor element electrode being different from the first semiconductor element electrode.

According to this method, it is possible to change connection between the signal line coming out from the logic circuit unit and the semiconductor element electrode, in response to change in operating state, i.e., change in contents of processing of the logic circuit unit. Consequently, it becomes possible to realize a semiconductor integrated circuit in which one semiconductor element electrode is shared by a plurality of signal lines, thereby reducing the required number of semiconductor element electrodes.

A eleventh aspect of the present invention provides the controlling method of the semiconductor integrated circuit as defined in the tenth aspect, the controlling method further comprising: generating connection information relating to the first electrical connection and the second electrical connection; controlling the electrical connection to be made by the performing the first electrical connection and the performing the second electrical connection, based on the generated connection information; and notifying an external semiconductor integrated circuit of the generated connection information.

According to the method, it is possible to control the new connection between the signal line coming out from the logic circuit unit and the semiconductor element electrode. Furthermore, it is possible for the external semiconductor integrated circuit, as well, to make necessary setup for sending and receiving signals, based on the connection information.

A twelfth aspect of the present invention provides the controlling method of the semiconductor integrated circuit as defined in the tenth aspect, wherein the performing the second electrical connection includes retaining the second electrical connection of the selected signal line to the second semiconductor element electrode until a predetermined retaining period terminates.

A thirteenth aspect of the present invention provides the controlling method of the semiconductor integrated circuit as defined in the twelfth aspect, wherein the performing the second electrical connection includes maintaining the second semiconductor element electrode at high impedance during the predetermined retaining period.

According to these methods, a predetermined retaining period is provided when making a new connection between the signal line coming out from the logic circuit unit and the semiconductor element electrode. During the predetermined retaining period, the semiconductor element electrode concerned is maintained at high impedance, thereby, the new electrical connection in the semiconductor integrated circuit concerned can be made certainly and safely.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 9 illustrates signal allocation of a second semiconductor integrated circuit in Embodiment 4 of the present invention.

FIG. 10 illustrates signal allocation of a third semiconductor integrated circuit in Embodiment 4 of the present invention.

FIG. 11 illustrates signal allocation of a semiconductor integrated circuit in the conventional art.

DETAILED DESCRIPTION OF THE PREFERRED EMBODIMENTS

Embodiments of the present invention are explained with reference to the accompanying drawings.

Embodiment 1

Figure 1:
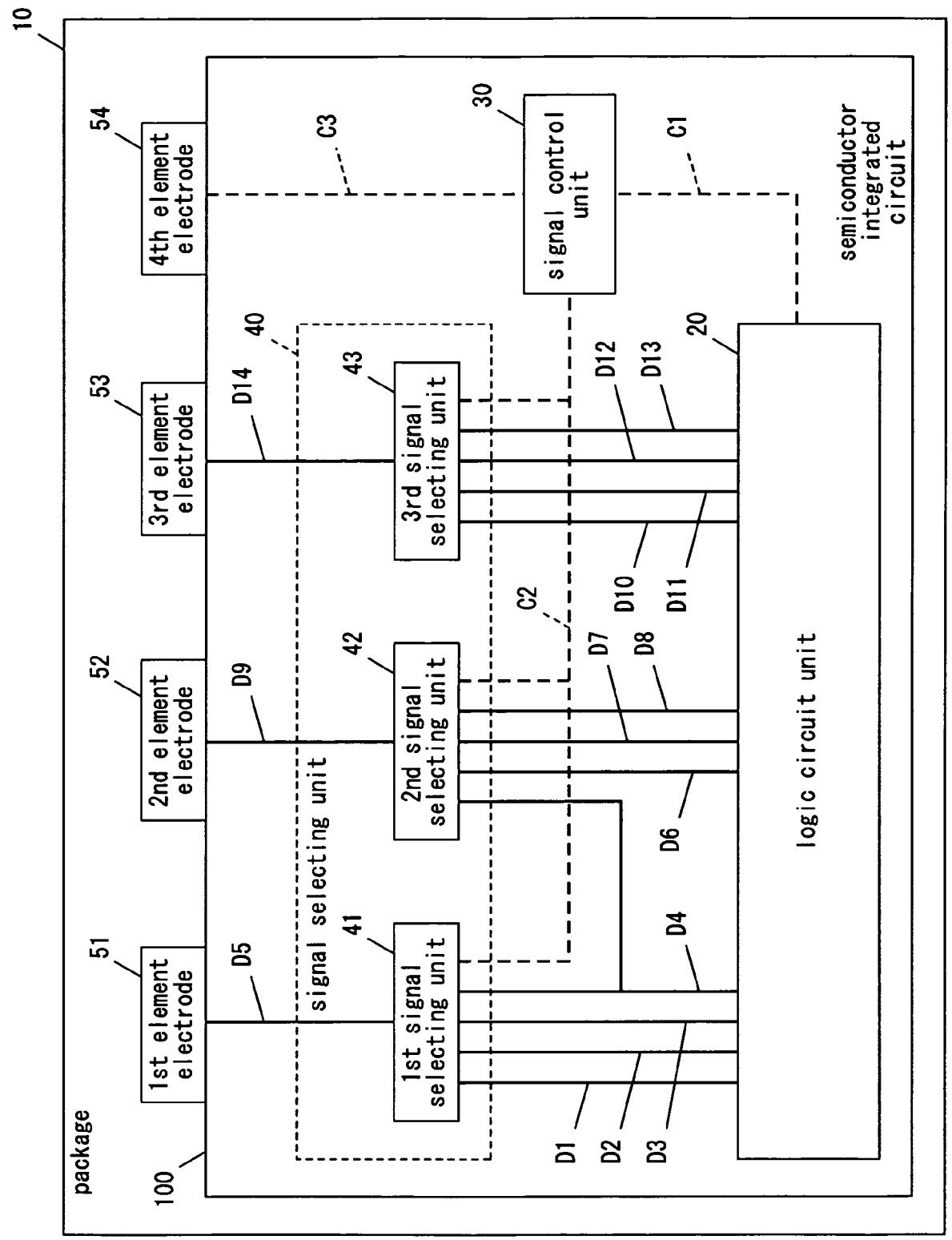
FIG. 1 is a block diagram illustrating a semiconductor integrated circuit in Embodiment 1 of the present invention.

FIG. 1 is a block diagram illustrating a semiconductor integrated circuit in Embodiment 1 of the present invention. A semiconductor integrated circuit 100 according to the present embodiment is built in a package 10. External terminals which the package 10 possesses are not illustrated.

The semiconductor integrated circuit 100 according to the present embodiment comprises a logic circuit unit 20, a signal control unit 30, a signal selecting unit 40, a first element electrode 51, a second element electrode 52, a third element electrode 53 and a fourth element electrode 54. The signal selecting unit 40 includes a first signal selecting unit 41, a second signal selecting unit 42 and a third signal selecting unit 43.

The first signal selecting unit 41 selects one of the signal lines D1, D2, D3 and D4 that come out from the logic circuit unit 20, and connects the selected signal line to a signal line D5 that is connected to the first element electrode 51.

The second signal selecting unit 42 selects one of the signal lines D4, D6, D7 and D8 that come out from the logic circuit unit 20, and connects the selected signal line to a signal line D9 that is connected to the second element electrode 52.

The third signal selecting unit 43 selects one of the signal lines D10, D11, D12 and D13 that come out from the logic circuit unit 20, and connects the selected signal line to a signal line D14 that is connected to the third element electrode 53.

When contents of processing of the logic circuit unit 20 is changed, change of the operating state is notified to the signal control unit 30 from the logic circuit unit 20 via a control signal line C1. The signal control unit 30 detects the change of the operating state of the logic circuit unit 20, and generates connection information. The signal control unit 30 notifies the signal selecting unit 40 of the generated connection information via a control signal line C2. At the same time, the signal control unit 30 notifies an external LSI of the generated connection information via the control signal line C3, which is connected to the element electrode D54. This connection information indicates which signal lines D1 through D4, D6 through D8, and D10 through D13 is connected to each of the first element electrode 51, the second element electrode 52 and the third element electrode 53.

The first signal selecting unit 41, the second signal selecting unit 42 and the third signal selecting unit 43 make electric connection respectively based on the notified connection information.

An external LSI which is in connection relationship with the semiconductor integrated circuit 100 configures the setting for performing signal transmission/reception with the semiconductor integrated circuit 100 based on the notified connection information.

In the semiconductor integrated circuit 100 according to the present embodiment, the signal line D4 coming out from the logic circuit unit 20 is connected to the first signal selecting unit 41 and the second signal selecting unit 42. Thereby, the signal line D4 can be connected to the first element electrode 51 or the second element electrode 52, according to the operating state of the logic circuit unit 20. The above-described structure that enables a signal line coming out from the logic circuit unit 20 to be connected to a plurality of element electrodes 50 is one of the features of the present invention. The explanation and effect of such structure is described in more detail in Embodiment 4 of the present invention.

When the logic circuit unit 20 is installed in a system LSI for a mobile phone, the change of the operating state of the logic circuit unit 20 means the change of an external device which the logic circuit unit 20 uses and also the change of the contents of signal processing which the logic circuit unit 20 processes, accompanying the change in the operating mode, such as a video shooting mode using a camera, a normal voice call mode and a videophone mode using a camera and a microphone.

Figure 2:
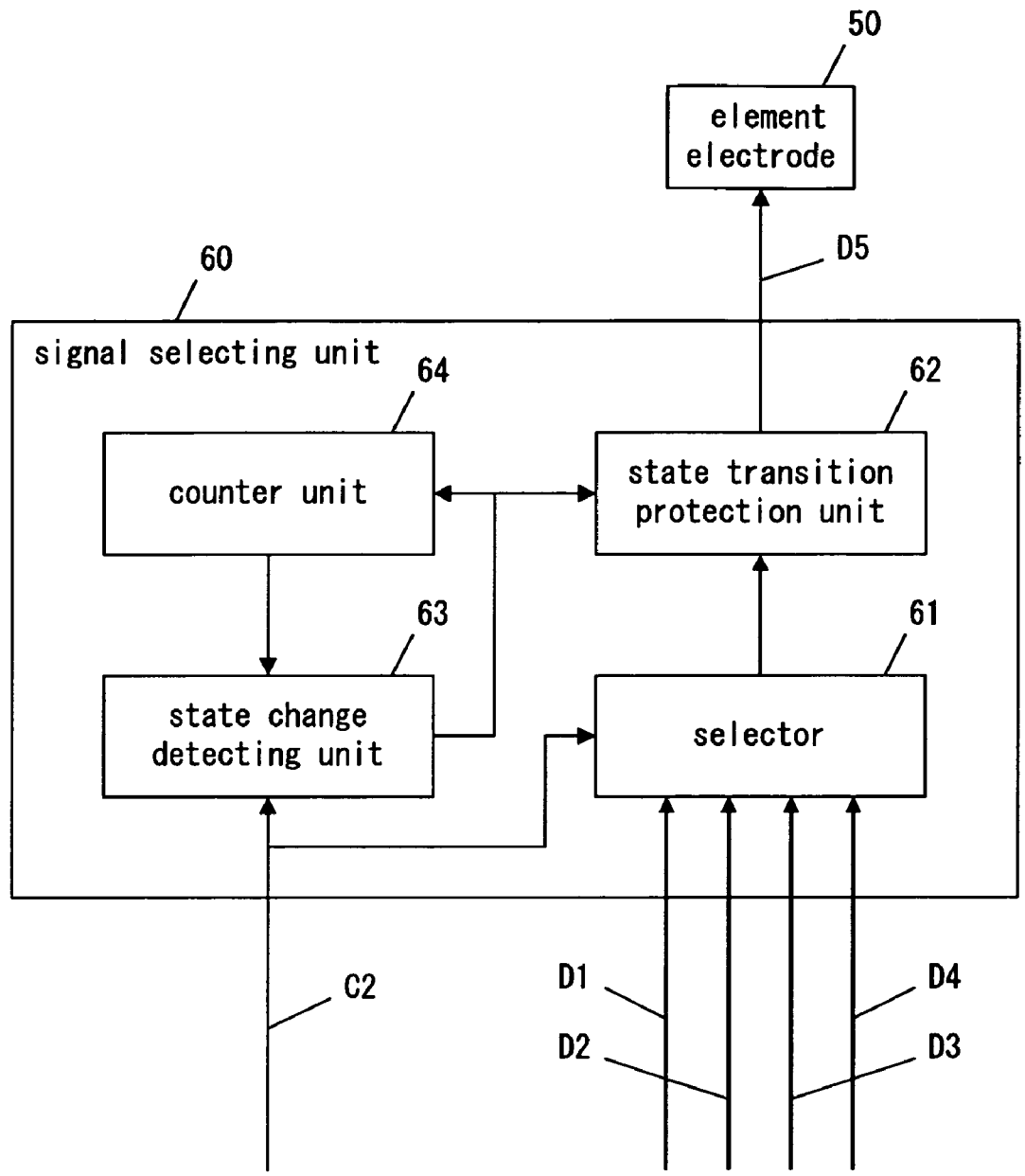
FIG. 2 is a block diagram illustrating a signal selecting unit in Embodiment 1 of the present invention.

FIG. 2 is a block diagram illustrating a signal selecting unit in Embodiment 1 of the present invention. A signal selecting unit 60 and an element electrode 50 according to the present embodiment exemplify the first signal selecting unit 41 and the first element electrode 51 that are shown in FIG. 1. The signal selecting unit 60 is equally applicable to the second signal selecting unit 42 and the third signal selecting unit 43.

The signal selecting unit 60 according to the present embodiment comprises a selector 61, a state transition protection unit 62, a state change detecting unit 63 and a counter unit 64.

The signal lines D1 through D4 coming out from the logic circuit unit 20 of FIG. 1 are connected to the selector 61. The control signal line C2 from the signal control unit 30 is connected to the selector 61 and the state change detecting unit 63.

Figure 7:
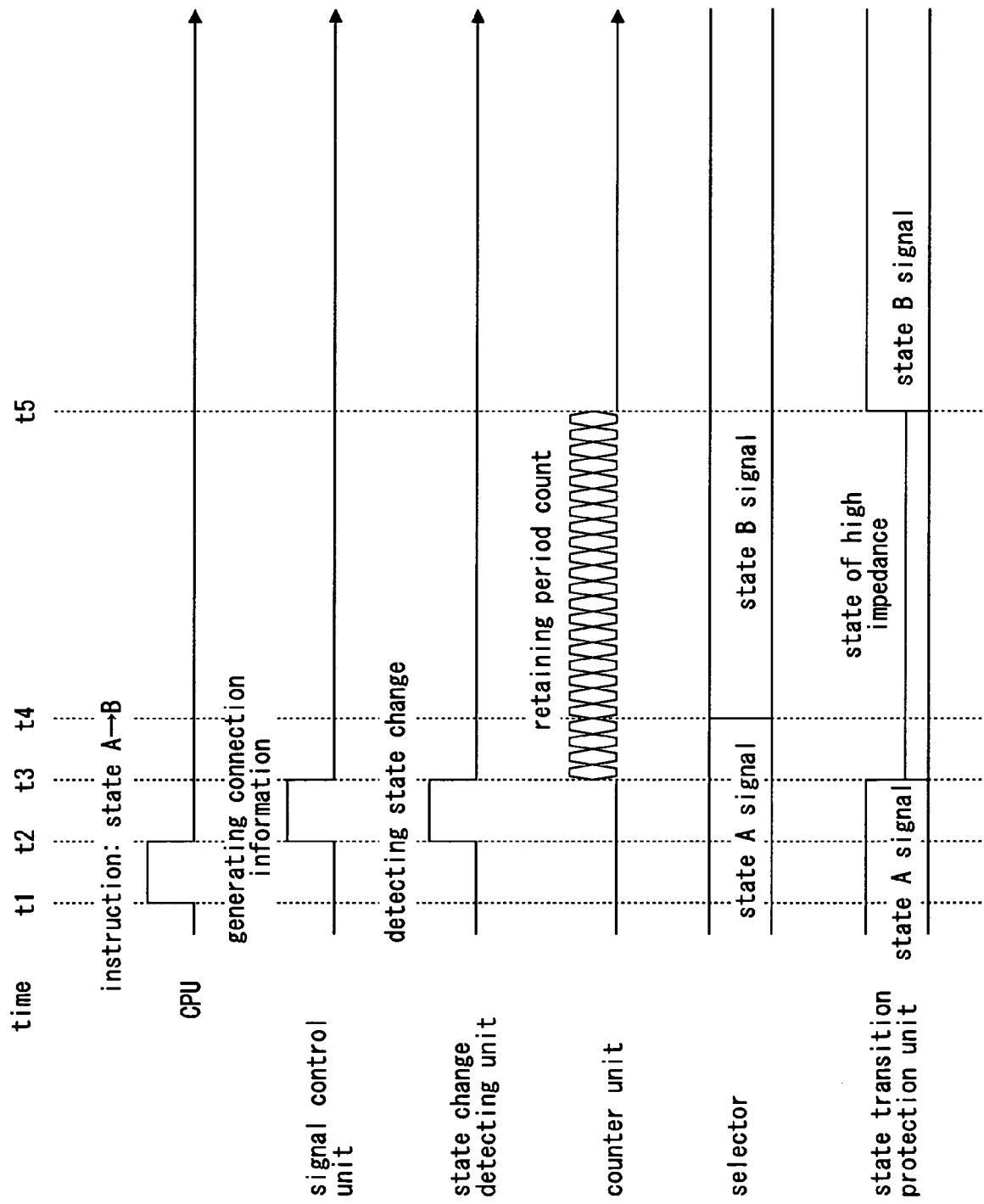
FIG. 7 is a timing chart of a signal selecting unit in Embodiment 1 of the present invention.

FIG. 7 is a timing chart of a signal selecting unit in Embodiment 1 of the present invention. The horizontal axis of FIG. 7 indicates time.

Operation of the signal selecting unit 60 according to the present embodiment is explained with reference to FIG. 1, FIG. 2 and FIG. 7.

At time t1, CPU installed in the logic circuit unit 20 notifies the signal control unit 30, via the control signal line C1, that an operating state in the logic circuit unit 20 has changed from an operating state A to an operating state B. At this time, the selector 61 selects a signal of the operating state A, and outputs the selected signal to the state transition protection unit 62. The state transition protection unit 62 outputs the signal of the operating state A to the element electrode 50.

At time t2, the signal control unit 30 generates new connection information, and sends the connection information to the selector 61 and the state change detecting unit 63 via the control signal line C2. The state change detecting unit 63 detects that the operating state has changed in the logic circuit unit 20, and notifies the state transition protection unit 62 and the counter unit 64 that the operating state has changed.

At time t3, the state transition protection unit 62 cuts off the signal of the operating state A outputted to the element electrode 50, and sets the element electrode 50 in a state of high impedance. Simultaneously, the counter unit 64 starts counting a retaining period.

At time t4, based on the connection information transmitted from the signal control unit 30, the selector 61 changes connection from the signal of the operating state A to the signal of the operating state B, and outputs the connected signal to the state transition protection unit 62. However, the element electrode 50 still remains in the state of high impedance.

At time t5, the counter unit 64 counts the predetermined time and notifies the state change detecting unit 63 that the retaining period has terminated. In response to this notice, the state transition protection unit 62 sets the element electrode 50 free from the state of high impedance, and outputs the signal of the operating state B to the element electrode 50.

As described above, according to the semiconductor integrated circuit 100 of the present embodiment, in response to change of the operating state of the logic circuit unit 20, it is possible to select one of a plurality of signal lines coming out from the logic circuit unit 20 and to connect the selected signal line to the corresponding element electrode 50. During this connection change, a retaining time is provided so that the external LSI, which is in connection relationship with the semiconductor integrated circuit 100, can afford a time margin for setting to properly receive signals from the semiconductor integrated circuit 100. In the meantime, a safe connection change is performed by setting the connection-changing element electrode 50 in the state of high impedance, thereby preventing occurrence of potential failure accompanying the connection change.

In the semiconductor integrated circuit 100 shown in FIG. 1, the number of the element electrode 50 which performs signal transmission/reception with the external device is four, however, the present number is just an example; the number of the element electrode 50 and the number of the signal selecting unit 40 can be set as many as the function of the semiconductor integrated circuit 100 requires.

Embodiment 2

Figure 3:
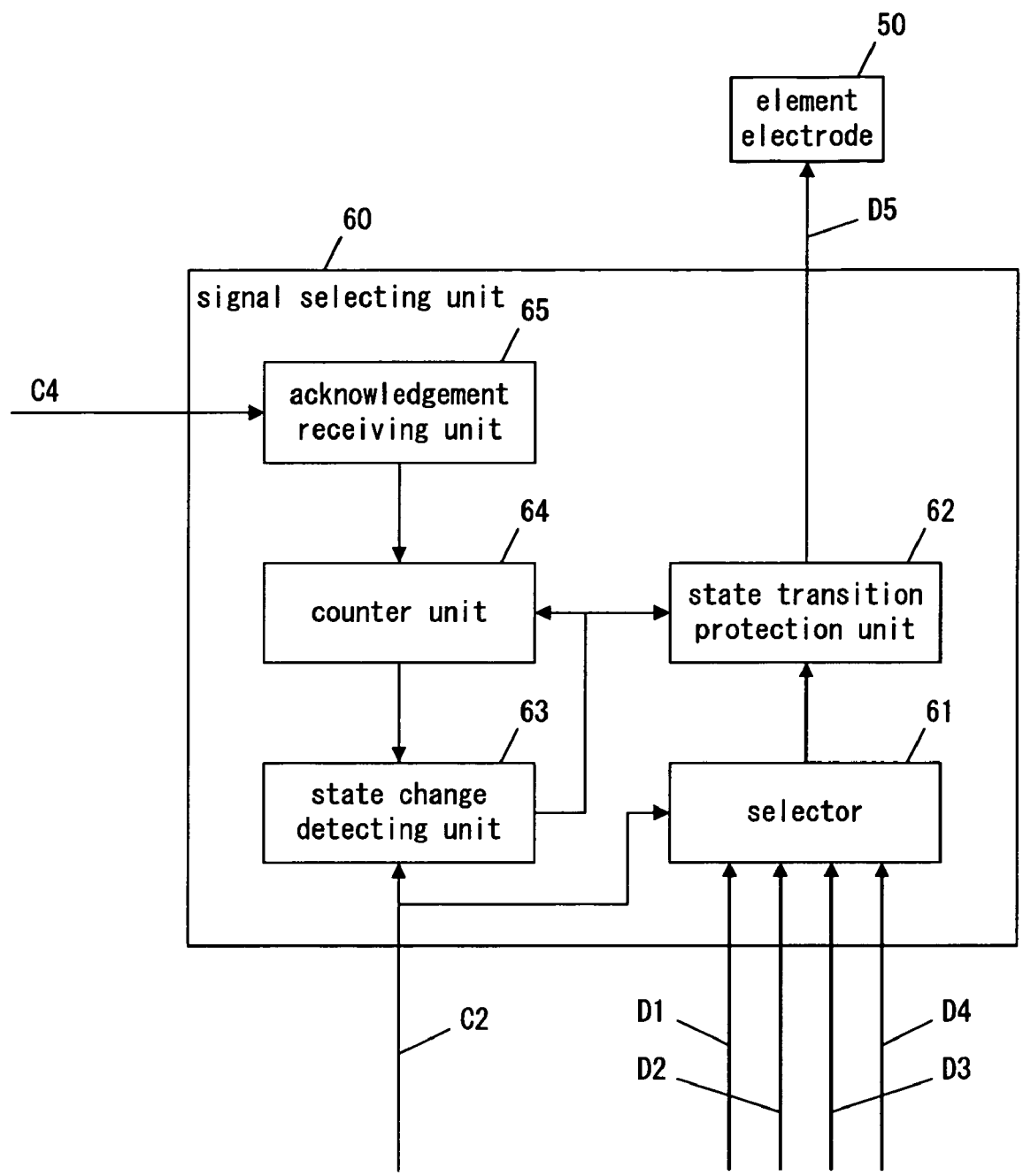
FIG. 3 is a block diagram illustrating a signal selecting unit in Embodiment 2 of the present invention.

FIG. 3 is a block diagram illustrating a signal selecting unit in Embodiment 2 of the present invention. In FIG. 3, the same symbols are given to elements each having the same function as elements of FIG. 2 in order to omit explanation.

Compared with the signal selecting unit 60 shown in FIG. 2, a signal selecting unit 60 of the present embodiment further comprises an acknowledgement receiving unit 65.

When the signal selecting unit 60 of the present embodiment is employed as the first signal selecting unit 41 shown in FIG. 1, the operation of the semiconductor integrated circuit 100 is the same as that of the semiconductor integrated circuit 100 in Embodiment 1 of the present invention, except for the following point.

In other words, when contents of processing of the logic circuit unit 20 is changed and the operating state changes from the operating state A to the operating state B, then, at time t2 of FIG. 7, the signal control unit 30 generates new connection information, and notifies the external LSI in connection relationship with the semiconductor integrated circuit 100 of the new connection information. After receiving notice of the connection information, the external LSI changes the setup, and then issues, to the semiconductor integrated circuit 100, an acknowledgement signal acknowledging the connection information. The acknowledgement receiving unit 65 receives this acknowledgement signal via a control signal line C4, and then notifies the counter unit 64 of the reception of the acknowledgement signal. The counter unit 64 terminates the counting of the retaining period that started at time t3 of FIG. 7 (the termination of the counting corresponds to time t5).

As described above, in the signal selecting unit 60 of the present embodiment, the retaining period can be counted and terminated by the selector 61. The termination of the retaining period can be determined by receiving the acknowledgement signal for the connection information from the external LSI in connection relationship with the semiconductor integrated circuit 100. Of course, during the retaining period, the element electrode 50 is kept in the state of high impedance and the selector 61 switches from the signal of the operation state A to the signal of the operation state B. As a result, it is possible to realize a safe connection change, thereby preventing occurrence of the potential failure.

The semiconductor integrated circuit 100 employing the signal selecting unit 60 of the present embodiment can execute the connection change of the signal selecting unit 40 in much shorter retaining period than the semiconductor integrated circuit 100 in Embodiment 1 of the present invention.

Embodiment 3

Figure 4:
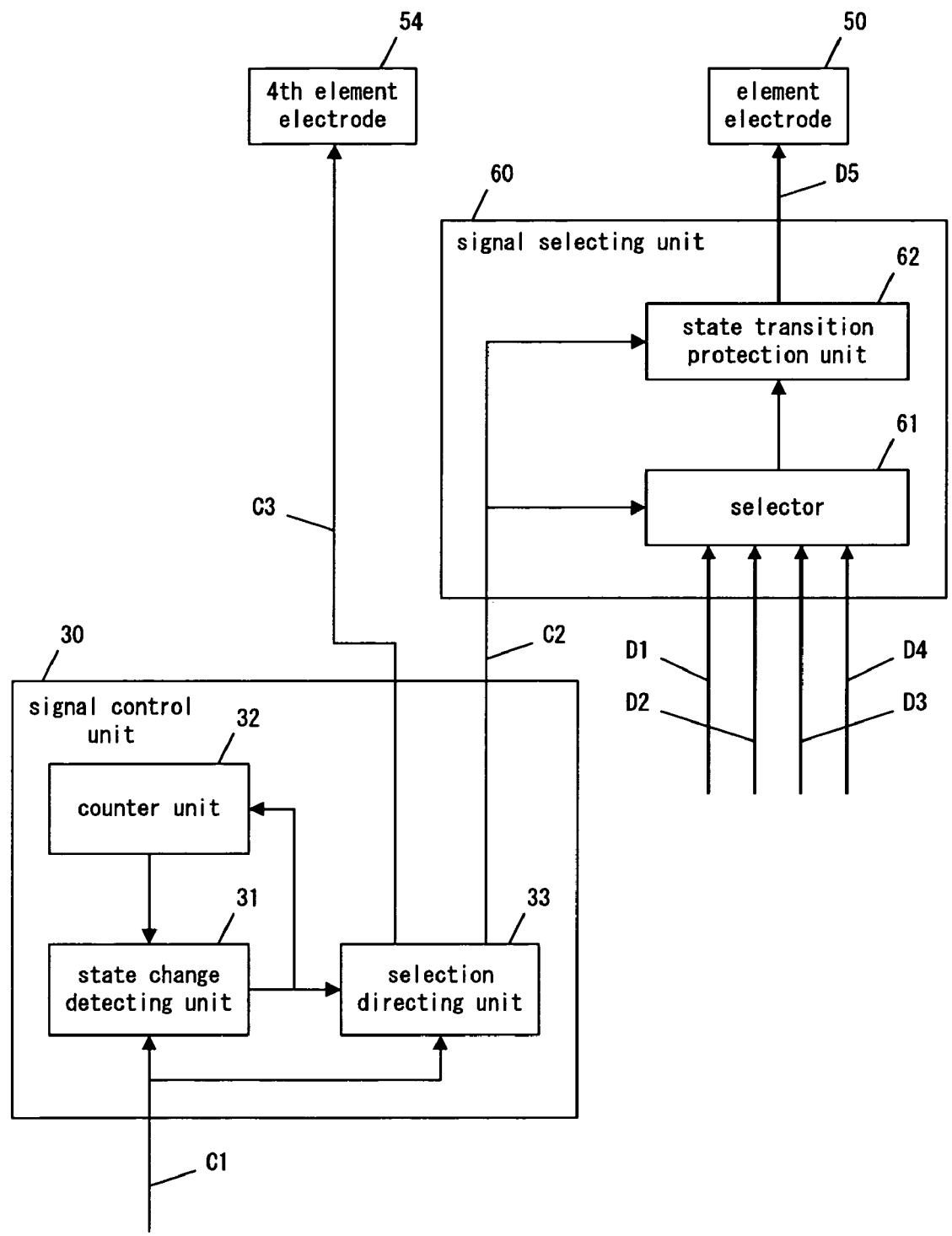
FIG. 4 is a block diagram illustrating a signal control unit and a signal selecting unit in Embodiment 3 of the present invention.

FIG. 4 is a block diagram illustrating a signal control unit and a signal selecting unit in Embodiment 3 of the present invention. In FIG. 4, the same symbols are given to elements each having the same function as elements of FIG. 2 in order to omit explanation.

According to the present embodiment shown in FIG. 4, a signal selecting unit 60 comprises a selector 61 and a state transition protection unit 62; and a signal control unit 30 comprises a state change detecting unit 31, a counter unit 32, and a selection directing unit 33.

The following explains operation of the semiconductor integrated circuit 100, when the signal control unit 30 and the signal selecting unit 60 according to the present embodiment are employed as the signal control unit 30 and the first signal selecting unit 41 shown in FIG. 1.

A CPU possessed by the logic circuit unit 20 notifies the signal control unit 30, via a control signal line C1, that the operation state has changed from the operating state A to the operating state B as the result of change in the contents of processing of the logic circuit unit 20.

After receiving notice of the change of the operating state, the selection directing unit 33 generates new connection information, which is then notified to the selector 61, and simultaneously to the external LSI in connection relationship with the semiconductor integrated circuit 100, via the element electrode D54.

Moreover, after receiving notice of the change of the operation state, the state change detecting unit 31 detects the change of the operating state of the logic circuit unit 20, and notifies the selection directing unit 33 and the counter unit 32 that the retaining period starts.

Receiving notice of the start of the retaining period, the selection directing unit 33 gives the state transition protection unit 62 a piece of instruction to set the output to high impedance. The state transition protection unit 62 sets the element electrode 50 at high impedance. At this time, the output to the element electrode 50 changes from the signal of the operating state A to the state of high impedance.

The counter unit 32, upon receipt of the notice of start of the retaining period, starts counting the retaining period.

After confirming that the retaining period has started, the selector 61 switches over from the signal of the operating state A to the signal of the operating state B; and outputs the signal of the operating state B to the state transition protection unit 62.

The counter unit 32 counts the predetermined time, and notifies the state change detecting unit 31 of the termination of the retaining period. The state change detecting unit 31 notifies the selection directing unit 33 of the termination of the retaining period.

After receiving notice of the termination of the retaining period, the selection directing unit 33 gives the state transition protection unit 62 a piece of instruction to set the output free from the state of high impedance. At this time, the output to the element electrode 50 changes from the state of high impedance to the signal of the operating state B.

As described above, according to the semiconductor integrated circuit 100 of the present embodiment, in response to change of the operating state of the logic circuit unit 20, it is possible to select one of a plurality of signal lines coming out from the logic circuit unit 20 and to connect the selected signal line to the corresponding element electrode 50. During this connection change, a retaining time is provided so that the external LSI, which is in connection relationship with the semiconductor integrated circuit 100, can afford a time margin for setting to properly receive signals from the semiconductor integrated circuit 100. In the meantime, a safe connection change is performed by setting the connection-changing element electrode 50 in the state of high impedance, thereby preventing occurrence of potential failure accompanying the connection change.

In the signal control unit 30 of the present embodiment, the counting of the retaining period is performed based on the reference value that is preset within the counter unit 32. However, the termination of the retaining period can be determined by using the acknowledgement signal, as in the case of the signal selecting unit 60 of Embodiment 2 of the present invention shown in FIG. 3. That is to say, by adding to the signal control unit 30 of FIG. 4 the acknowledgement receiving unit 65 operable to receive the acknowledgement signal for the connection information from the external LSI, which is in connection relationship with the semiconductor integrated circuit 100 of the present embodiment, the signal control unit 30 can determine the termination of the retaining period.

Embodiment 4

Figure 5:
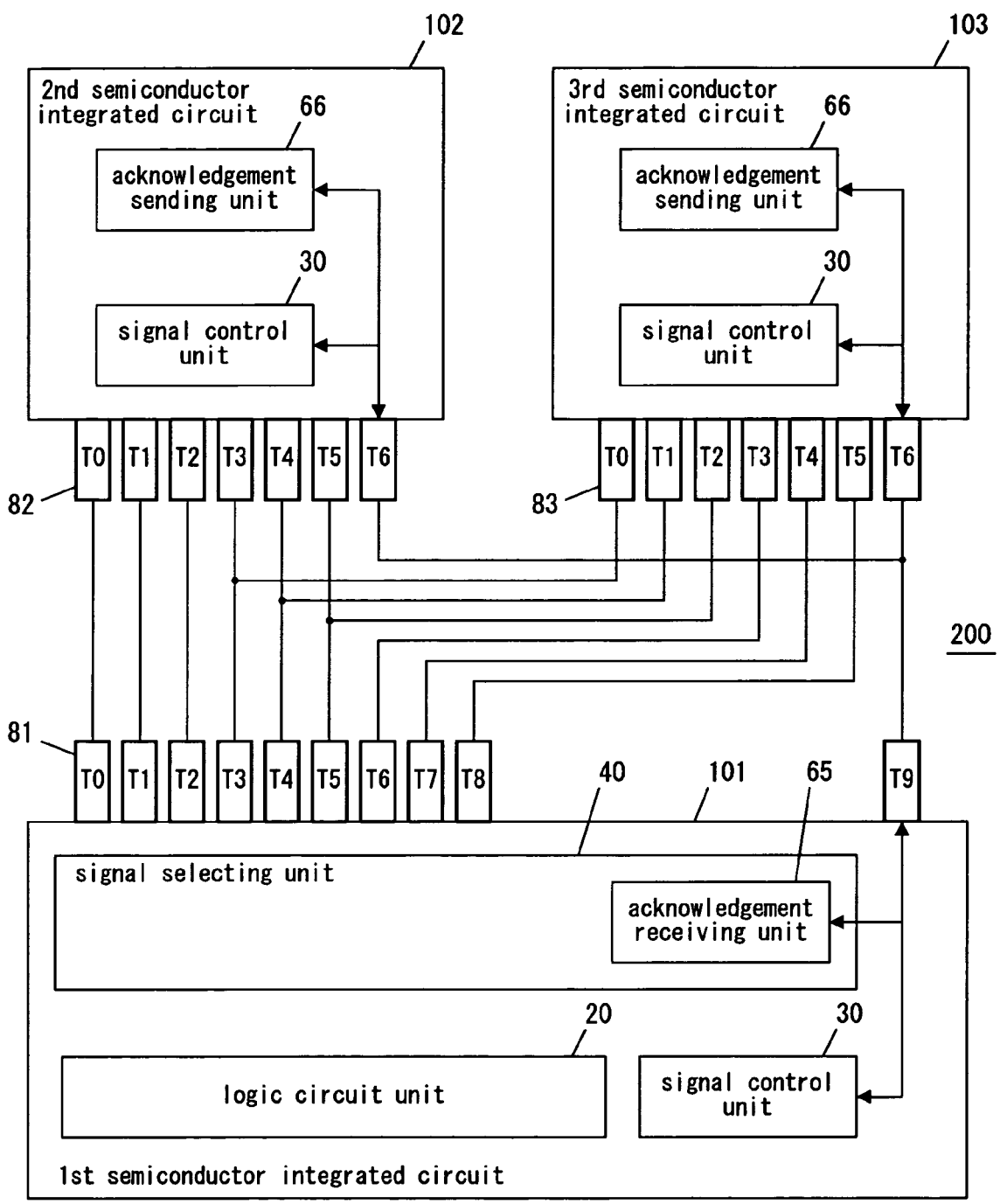
FIG. 5 is a block diagram illustrating an electronic device in Embodiment 4 of the present invention.

FIG. 5 is a block diagram illustrating an electronic device in Embodiment 4 of the present invention. An electronic device 200 of the present embodiment comprises a first semiconductor integrated circuit 101, a second semiconductor integrated circuit 102, and a third semiconductor integrated circuit 103.

The first semiconductor integrated circuit 101 is a semiconductor integrated circuit possessing a function that is similar to the function of the semiconductor integrated circuit 100 in Embodiment 1 of the present invention, shown in FIG. 1. The first semiconductor integrated circuit 101 possesses 10 external terminals T0 to T9. These external terminals T0 to T9 are connected to the element electrodes of the first semiconductor integrated circuit 101. The details are mentioned later.

The second semiconductor integrated circuit 102 and the third semiconductor integrated circuit 103 are semiconductor integrated circuits corresponding to external LSIs, each of which is in connection relationship with the first semiconductor integrated circuit 101. Each of the second semiconductor integrated circuit 102 and the third semiconductor integrated circuit 103 possesses 7 external terminals T0 to T6. In addition to the function that is similar to the function of the semiconductor integrated circuit 100 in Embodiment 1 of the present invention, shown in FIG. 1, the second semiconductor integrated circuit 102 and the third semiconductor integrated circuit 103 possess, respectively, an acknowledgement sending unit 66 operable to send an acknowledgement signal after receiving connection information and making a necessary setup according to the connection information.

The mutual connection relationship of the electronic device 200 of the present embodiment is explained in the following.

The external terminals T0 to T5 of the first semiconductor integrated circuit 101 are respectively connected to the external terminals T0 to T5 of the second semiconductor integrated circuit 102. The external terminals T3 to T8 of the first semiconductor integrated circuit 101 are respectively connected to the external terminals T0 to T5 of the third semiconductor integrated circuit 103. The connection between these external terminals constitutes a path operable to send and receive signals (data). In this connection relationship, the following should be noted: the external terminals T3 to T5 of the first semiconductor integrated circuit 101 are connected to the external terminals T3 to T5 of the second semiconductor integrated circuit 102 and the external terminals T0 to T2 of the third semiconductor integrated circuit 103, as well.

The external terminal T9 of the first semiconductor integrated circuit 101 is connected to the external terminal T6 of the second semiconductor integrated circuit 102 and the external terminal T6 of the third semiconductor integrated circuit 103. The connection between those external terminals constitutes a path operable to send and receive control signals such as connection information.

Next, the following explains sending and receiving of signals in an electronic device 200 of the present embodiment.

Figure 8:
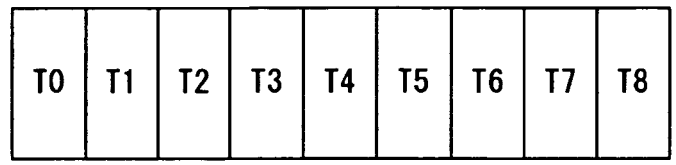
FIG. 8 illustrates signal allocation of a first semiconductor integrated circuit in Embodiment 4 of the present invention.
Figure 8:
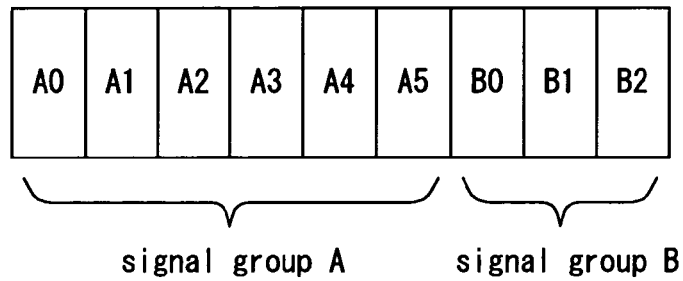
Figure 8:
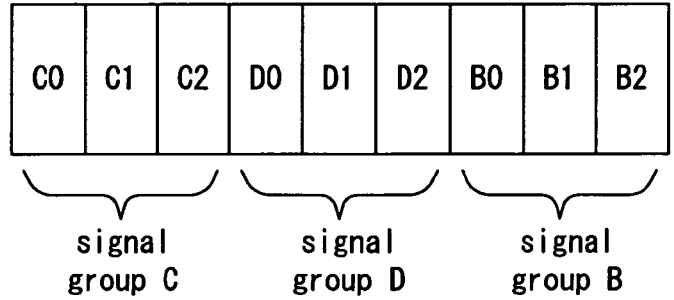
Figure 8:
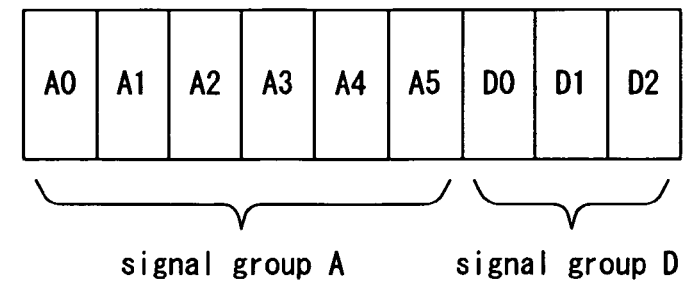

FIG. 8 illustrates signal allocation of the first semiconductor integrated circuit 101 in Embodiment 4 of the present invention. FIG. 8 shows allocation of output signals on the external terminals accompanying the change of the operating state of the logic circuit unit 20 in the first semiconductor integrated circuit 101.

FIG. 9 illustrates signal allocation of the second semiconductor integrated circuit 102 in Embodiment 4 of the present invention. FIG. 9 shows allocation of incoming signals on the external terminals of the second semiconductor integrated circuit 102 accompanying the change of the operating state of the logic circuit unit 20 in the first semiconductor integrated circuit 101.

FIG. 10 illustrates signal allocation of the third semiconductor integrated circuit 103 in Embodiment 4 of the present invention. FIG. 10 shows allocation of incoming signals on the external terminals of the third semiconductor integrated circuit 103 accompanying the change of the operating state of the logic circuit unit 20 in the first semiconductor integrated circuit 101.

When the operating state of the logic circuit unit 20 in the first semiconductor integrated circuit 101 is changed to the operating state 1, the signal control unit 30 of the first semiconductor integrated circuit 101 generates connection information indicating that a signal group A (signals A0 to A5) and a signal group B (signals B0 to B2) are respectively outputted to the external terminals T0 to T8. The signal control unit 30 then notifies the second semiconductor integrated circuit 102 and the third semiconductor integrated circuit 103 of the connection information. Simultaneously, the first semiconductor integrated circuit 101 enters a retaining period. The notice of connection information is sent via the external terminal T9 of the first semiconductor integrated circuit 101, the external terminal T6 of the second semiconductor integrated circuit 102, and the external terminal T6 of the third semiconductor integrated circuit 103.

The signal control unit 30 of the second semiconductor integrated circuit 102 receives the connection information, and makes a setup to receive the signal group A (signals A0 to A5) from the own external terminals T0 to T5. After setting-up, the acknowledgement sending unit 66 sends an acknowledgement signal to the first semiconductor integrated circuit 101.

Similarly, the signal control unit 30 of the third semiconductor integrated circuit 103 receives the connection information, and makes a setup to receive the signal group B (signals B0 to B2) from the own external terminals T3 to T5. After setting-up, the acknowledgement sending unit 66 sends an acknowledgement signal to the first semiconductor integrated circuit 101.

In the first semiconductor integrated circuit 101, the acknowledgement receiving unit 65 receives the acknowledgement signals from the second semiconductor integrated circuit 102 and the third semiconductor integrated circuit 103, and then the retaining period is terminated. Afterwards, the signal group A (signals A0 to A5) and the signal group B (signals B0 to B2) are respectively outputted to the external terminals T0 to T8. As a result, in the operating state 1, the signal group A (signals A0 to A5) is sent from the first semiconductor integrated circuit 101 to the second semiconductor integrated circuit 102; and the signal group B (signals B0 to B2) is sent from the first semiconductor integrated circuit 101 to the third semiconductor integrated circuit 103.

Next, when the operating state of the logic circuit unit 20 in the first semiconductor integrated circuit 101 is changed to the operating state 2, the signal control unit 30 of the first semiconductor integrated circuit 101 generates new connection information indicating that a signal group C (signals C0 to C2), a signal group D (signals D0 to D2), and a signal group B (signals B0 to B2) are respectively outputted to the external terminals T0 to T8. The signal control unit 30 notifies the second semiconductor integrated circuit 102 and the third semiconductor integrated circuit 103 of the new connection information. Simultaneously, the first semiconductor integrated circuit 101 enters a retaining period.

The signal control unit 30 of the second semiconductor integrated circuit 102 receives the new connection information, and makes a setup to receive the signal group C (signals C0 to C2) from the own external terminals T0 to T2 and the signal group D (signals D0 to D2) from the own external terminals T3 to T5. The acknowledgement sending unit 66 sends an acknowledgement signal to the first semiconductor integrated circuit 101.

Similarly, the signal control unit 30 of the third semiconductor integrated circuit 103 receives the new connection information, and makes a setup to receive the signal group D (signals D0 to D2) from the own external terminals T0 to T2 and the signal group B (signals B0 to B2) from the own external terminals T3 to T5. The acknowledgement sending unit 66 sends an acknowledgement signal to the first semiconductor integrated circuit 101.

In the first semiconductor integrated circuit 101, the acknowledgement receiving unit 65 receives the acknowledgement signals from the second semiconductor integrated circuit 102 and the third semiconductor integrated circuit 103, and then the retaining period is terminated. Afterwards, the signal group C (signals C0 to C2), the signal group D (signals D0 to D2), and the signal group B (signals B0 to B2) are respectively outputted to the external terminals T0 to T8. As a result, in the operating state 2, the signal group C (signals C0 to C2) and the signal group D (signals D0 to D2) are sent from the first semiconductor integrated circuit 101 to the second semiconductor integrated circuit 102. The signal group D (signals D0 to D2) and the signal group B (signals B0 to B2)

are sent from the first semiconductor integrated circuit 101 to the third semiconductor integrated circuit 103.

Furthermore, when the operating state of the logic circuit unit 20 in the first semiconductor integrated circuit 101 is changed to the operating state 3, the signal control unit 30 of the first semiconductor integrated circuit 101 generates further new connection information indicating that the signal group A (signals A0 to A5) and the signal group D (signals D0 to D2) are respectively outputted to the external terminals T0 to T8. The signal control unit 30 notifies the second semiconductor integrated circuit 102 and the third semiconductor integrated circuit 103 of the further new connection information. Simultaneously, the first semiconductor integrated circuit 101 enters a retaining period. Here the following should be noted: when the operating state is changed from the operating state 2 to the operating state 3, the external terminals to output the signal group D (signals D0 to D2) are changed from the external terminals T3 to T5 to the external terminals T6 to T8.

The signal control unit 30 of the second semiconductor integrated circuit 102 receives the further new connection information, and makes a setup to receive the signal group A (signals A0 to A5) from the own external terminals T0 to T5. The acknowledgement sending unit 66 sends an acknowledgement signal to the first semiconductor integrated circuit 101.

Similarly, the signal control unit 30 of the third semiconductor integrated circuit 103 receives the further new connection information, and makes a setup to receive the signal group D (signals D0 to D2) from the own external terminals T3 to T5. The acknowledgement sending unit 66 sends an acknowledgement signal to the first semiconductor integrated circuit 101.

In the first semiconductor integrated circuit 101, the acknowledgement receiving unit 65 receives the acknowledgement signals from the second semiconductor integrated circuit 102 and the third semiconductor integrated circuit 103, and then the retaining period is terminated. Afterwards, the signal group A (signals A0 to A5) and the signal group D (signals D0 to D2) are respectively outputted to the external terminals T0 to T8. As a result, in the operating state 3, the signal group A (signals A0 to A5) is sent from the first semiconductor integrated circuit 101 to the second semiconductor integrated circuit 102. The signal group D (signals D0 to D2) is sent from the first semiconductor integrated circuit 101 to the third semiconductor integrated circuit 103.

What should be noted in the above-described operation of the electronic device 200 of the present embodiment is as follows: when the operating state is changed from the operating state 2 to the operating state 3 in the first semiconductor integrated circuit 101, the external terminals to output the signal group D (signals D0 to D2) are changed from the external terminals T3 to T5 to the external terminals T6 to T8. As a result, it becomes possible to reduce the number of external terminals that the first semiconductor integrated circuit 101 of the present embodiment requires in sending signals (data) to only 9 terminals, or the external terminals T0 to T8.

For comparison, FIG. 11 illustrates signal allocation of a semiconductor integrated circuit in the conventional art. The semiconductor integrated circuit in the conventional art does not possess a function operable to connect one of a plurality of signal lines coming out from the logic circuit unit 20, to a plurality of the element electrodes 50, and hence, to a plurality of external terminals. As a result, as shown in FIG. 11, the first semiconductor integrated circuit 101 needs to comprise 12 external terminals T0 to TB for sending and receiving signals (data) in order to output the signal group A (signals A0 to A5), the signal group B (signals B0 to B2), the signal group C (signals C0 to C2), and the signal group D (signals D0 to D2). Here, it is assumed that the signal group A (signals A0 to A5) and the signal group C (signals C0 to C2) are not outputted simultaneously and the signal group A (signals A0 to A5) and the signal group C (signals C0 to C2) can share the external terminals.

The above explanation makes it clear that the semiconductor integrated circuit 100 of the present invention can reduce the required external terminals in number.

Figure 6:
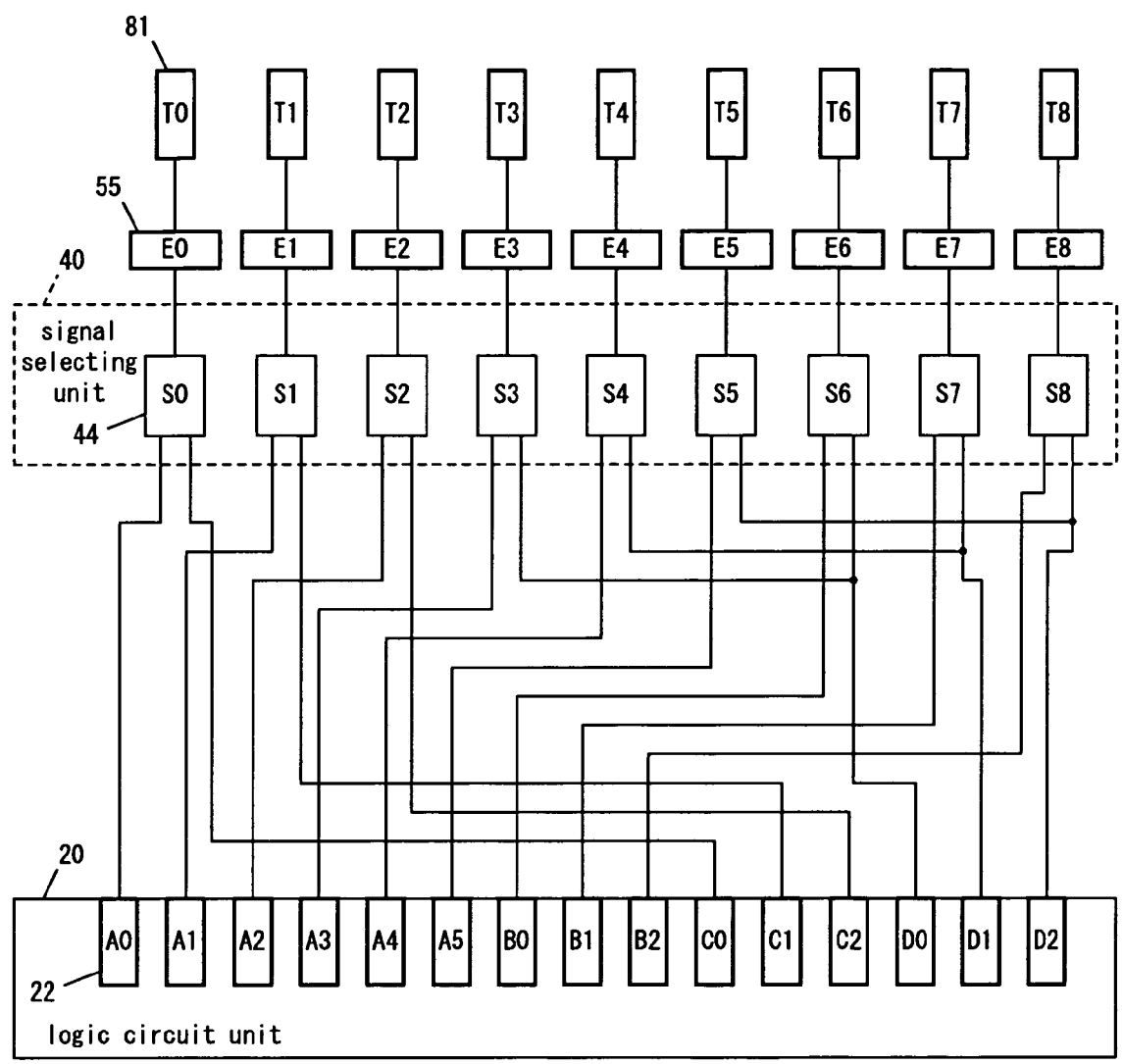
FIG. 6 is an explanatory drawing illustrating a signal selecting unit of a first semiconductor integrated circuit in Embodiment 4 of the present invention.

FIG. 6 is an explanatory drawing illustrating a signal selecting unit of the first semiconductor integrated circuit in Embodiment 4 of the present invention. FIG. 6 indicates connection between the signal lines coming out from the logic circuit unit 20 and the signal selecting unit 40 for realizing sending and receiving signals in the electronic device 200 of FIG. 5.

As shown in FIG. 6, in order to output the signal group A (signals A0 to A5), the signal group B (signals B0 to B2), the signal group C (signals C0 to C2), and the signal group D (signals D0 to D2), the logic circuit unit 20 possesses 15 signal lines A0 to D2 which come out to outside. (The signal line which sends control signals, such as connection information, is provided separately, and is omitted from description in the present explanation.)

The signal selecting unit 40 possesses 9 selecting units S0 to S8, the outputs of which are respectively connected to element electrodes E0 to E8, and further connected to the external terminals T0 to T8.

The selecting unit S0 selects either one of the signal lines A0 and C0 of the logic circuit unit 20, and then outputs the selected one to the element electrode E0. The selecting unit S1 selects either one of the signal lines A1 and C1 of the logic circuit unit 20, and then outputs the selected one to the element electrode E1. The other selecting units perform the selection in the same way.

However, the signal line D0 of the logic circuit unit 20 is connected to the selecting unit S3 and the selecting unit S6. The signal line D1 is connected to the selecting unit S4 and the selecting unit S7. The signal line D2 is connected to the selecting unit S5 and the selecting unit S8.

As mentioned above, according to the present structure, when the operating state of the logic circuit unit 20 is changed from the operating state 2 to the operating state 3, it is possible to change the external terminals to output the signal group D (signals D0 to D2) from the external terminals T3 to T5 to the external terminals T6 to T8.

Embodiment 5

Figure 12:
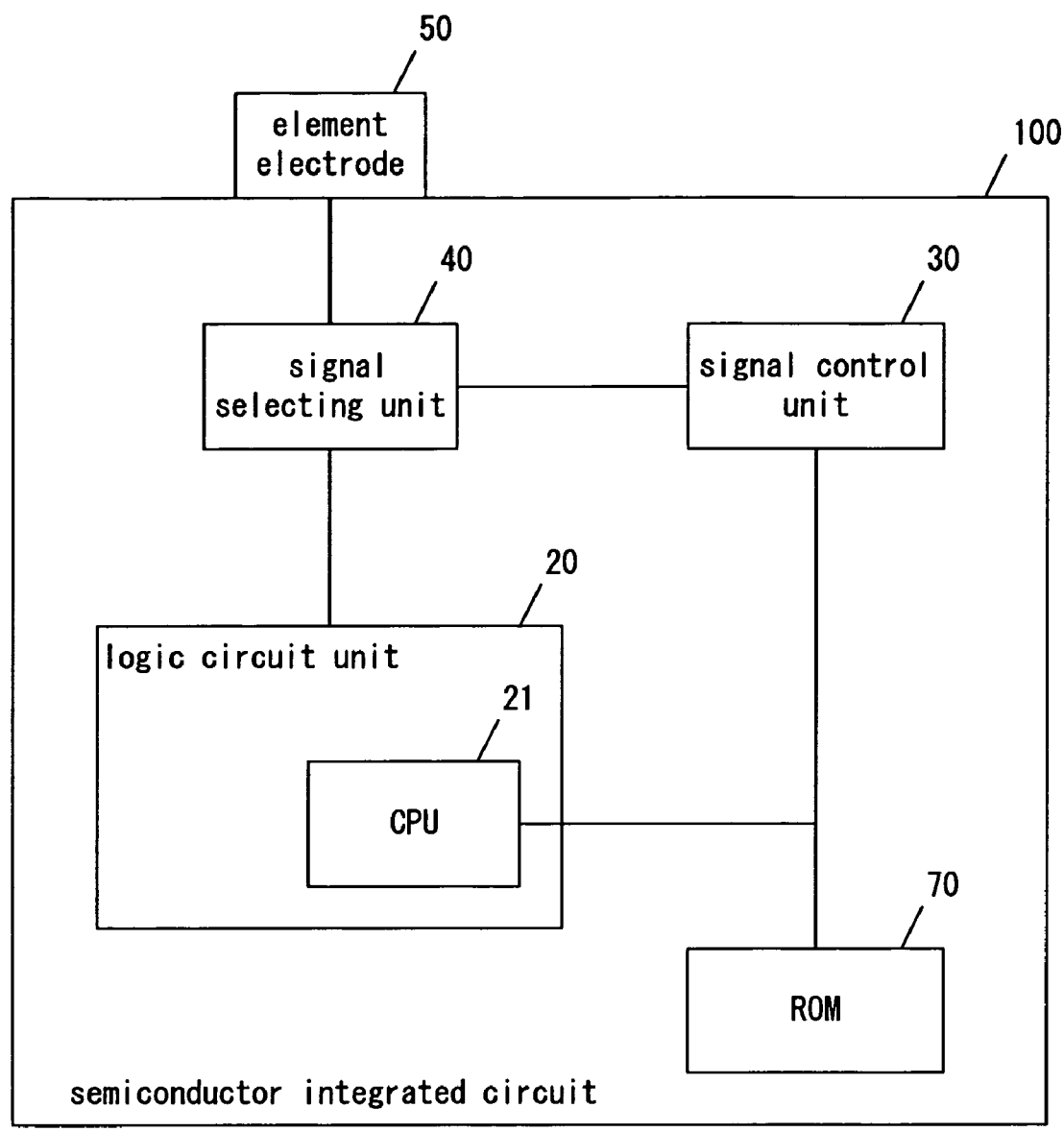
FIG. 12 is a block diagram illustrating a semiconductor integrated circuit in Embodiment 5 of the present invention.

FIG. 12 is a block diagram illustrating a semiconductor integrated circuit in Embodiment 5 of the present invention. In FIG. 12, the same symbols are given to elements each having the same function as elements of FIG. 1 in order to omit explanation.

A semiconductor integrated circuit 100 shown in FIG. 12 comprises a logic circuit unit 20, a signal control unit 30, a signal selecting unit 40, a ROM 70, and an element electrode 50. The logic circuit unit 20 possesses a CPU 21 operable to control the semiconductor integrated circuit 100 entirely, in addition to various functional circuits (not shown in the figure). In FIG. 12, the element electrode 50 represents a plurality of element electrodes. The signal selecting unit 40 represents a plurality of signal selecting units.

The ROM 70 stores a program for controlling the semiconductor integrated circuit 100. The CPU 21 reads and executes this program.

Figure 13:
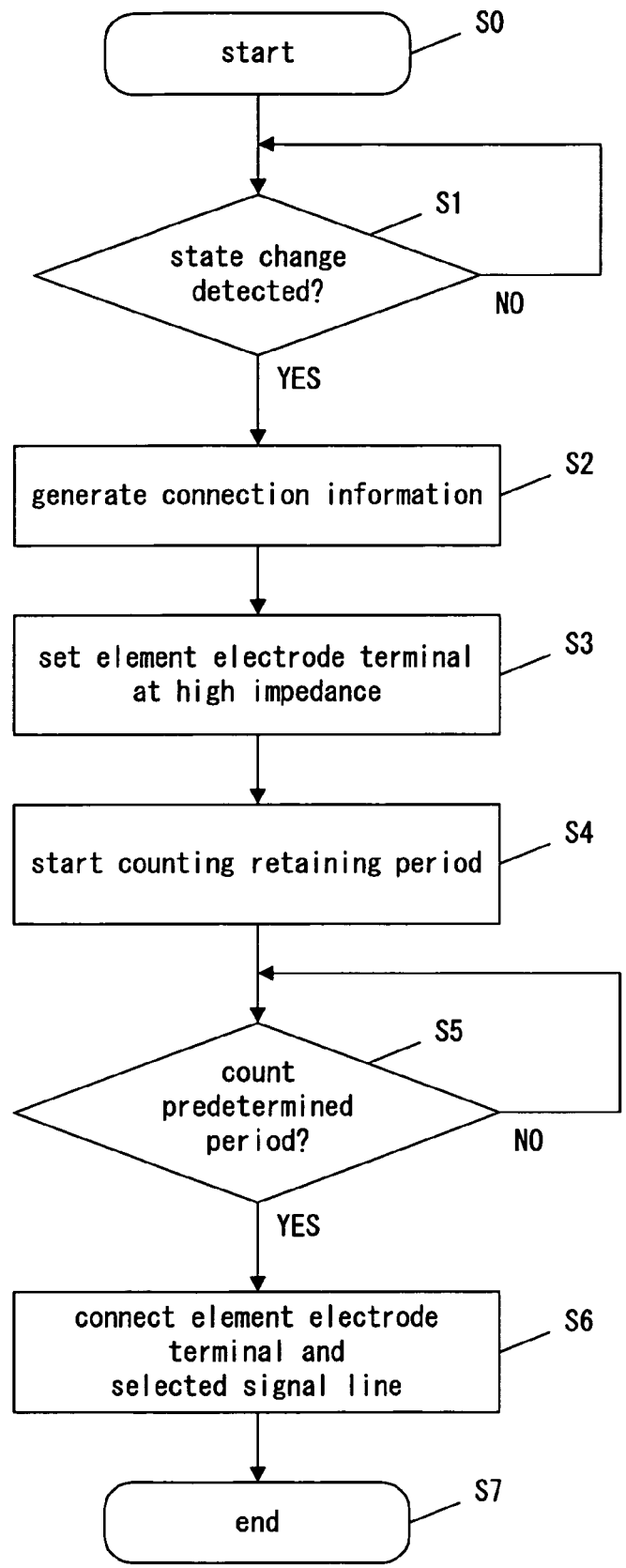
FIG. 13 is a flow chart of a semiconductor integrated circuit in Embodiment 5 of the present invention.
Figure 14:
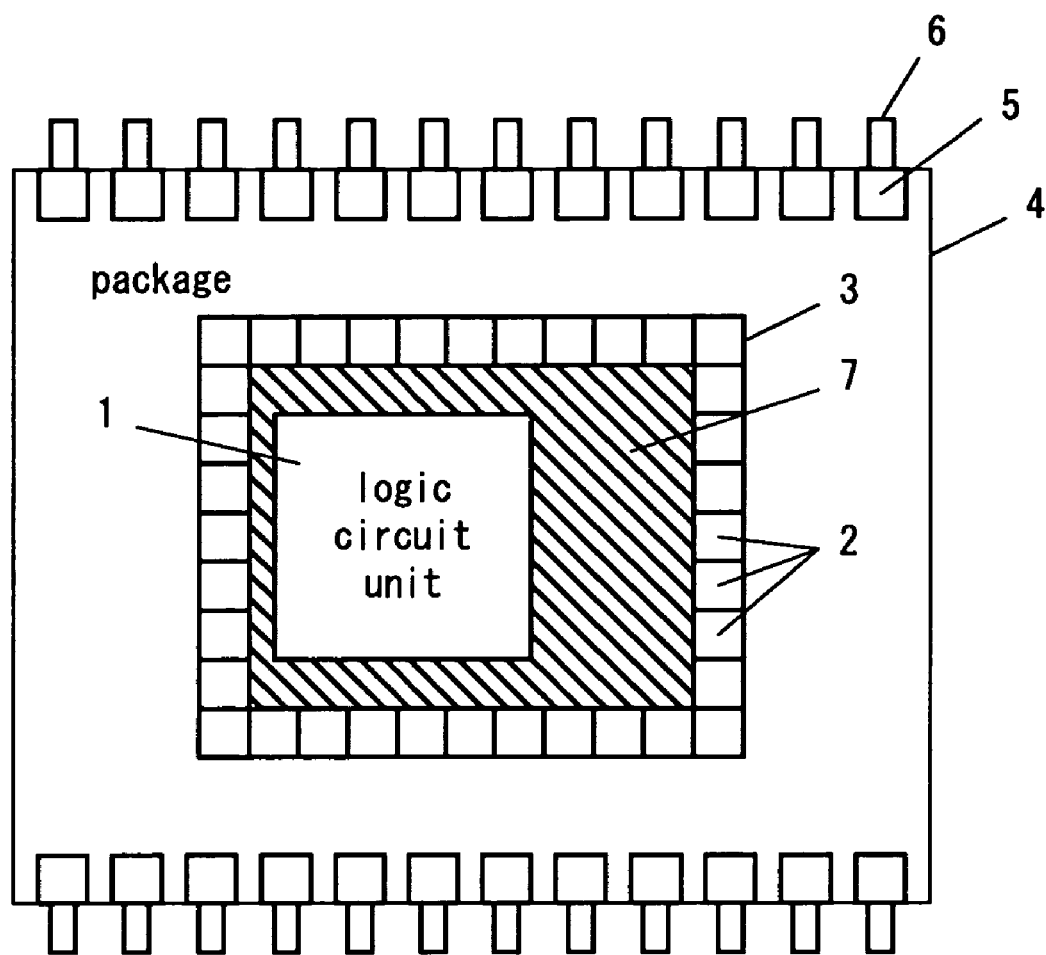
FIG. 14 is a layout drawing of the conventional packaged semiconductor integrated circuit.

FIG. 13 is a flow chart of a semiconductor integrated circuit in Embodiment 5 of the present invention. The ROM 70 stores a program for executing the flow chart.

According to the flow chart shown in FIG. 13, the following explains the operation of the semiconductor integrated circuit 100 of the present embodiment, when the signal selecting unit 60 in Embodiment 1 of the present embodiment shown in FIG. 2, is employed as the signal selecting unit 40.

In FIG. 13, a control program starts at Step S0.

At Step S1, the signal control unit 30 judges whether the operating state of the logic circuit unit 20 has changed. When the judgment result is "NO" (the change of the operating state is not detected), Step S1 is repeated. When the judgment result is "YES" (the change of the operating state is detected), the control moves to Step S2.

At Step S2, the signal control unit 30 generates connection information regarding connection between the signal line coming out from the logic circuit unit 20 and the element electrode 5, and then notifies the signal selecting unit 40 of the connection information. Simultaneously, the signal control unit 30 notifies the external LSI in connection relationship with the semiconductor integrated circuit 100 of the connection information.

At Step S3, the state change detecting unit 63 of FIG. 2, upon receipt of the connection information, gives the instruction to the state transition protection unit 62, thereby setting the element electrode 50 at high impedance.

At Step S4, the counter unit 64 starts counting a retaining period. While the counter unit 64 is counting the retaining period, the selector 61 selects a signal line of the logic circuit unit 20 according to the connection information, and then connects the selected signal line to the state transition protection unit 62. The external LSI makes a setup to receive signals (data) according to the connection information.

At Step S5, the counter unit 64 judges whether the predetermined retaining period has been counted. When the judgment result is "YES" (the predetermined retaining period is counted), the counter unit 64 sends to the state change detecting unit 63 a notice that the predetermined retaining period has been terminated. Then, the control moves to Step S6.

At Step S6, the state change detecting unit 63 receives the notice of termination of the retaining period, and gives an instruction to the state transition protection unit 62. The state change detecting unit 63 releases the setup of high impedance for the element electrode 50, and then sends the signal of the signal line which the selector 61 has already selected. In this way, a new signal accompanying the change of the operating state of the logic circuit unit 20 is sent to the external LSI from the element electrode 50.

At Step S7, a series of processing accompanying the change of the operating state of the logic circuit unit 20 is completed. The control may return to Step S1 again afterwards.

In the above-mentioned flow chart, although the retaining period is counted using a reference value which the counter unit 64 possesses inside, the retaining period may be alternatively terminated by receiving the acknowledgement signal to the connection information. When there are a lot of external LSIs in connection relationship with the semiconductor integrated circuit 100, terminating the retaining period by receiving the acknowledgement signal to the connection information from the external LSIs generally makes the retaining period shorter.

In all of the above-mentioned embodiments of the present invention, the operation is explained assuming that signals (data) are sent from the semiconductor integrated circuit 100 to the external LSI in connection relationship with the semiconductor integrated circuit 100. However, a signal can be sent bi-directionally.

For example, in the electronic device 200 of Embodiment 4 of the present invention shown in FIG. 5, when the first semiconductor integrated circuit 101 is in the operating state 1, as shown in FIGS. 8, 9, and 10, the signal group A (signals A0 to A5) is sent from the first semiconductor integrated circuit 101 to the second semiconductor integrated circuit 102 via the external terminals T0 to T5 of the first semiconductor integrated circuit 101 and the external terminals T0 to T5 of the second semiconductor integrated circuit 102. The signal group B (signals B0 to B2) is also sent from the first semiconductor integrated circuit 101 to the third semiconductor integrated circuit 103 via the external terminals T6 to T8 of the first semiconductor integrated circuit 101 and the external terminals T3 to T5 of the third semiconductor integrated circuit 103.

Simultaneously, in the present connection state, for example, a signal can also be sent from the second semiconductor integrated circuit 102 to the signal lines A0 to A5 of the first semiconductor integrated circuit 101, via the external terminals T0 to T5 of the second semiconductor integrated circuit 102, the external terminals T0 to T5 of the first semiconductor integrated circuit 101, and the signal selecting units S0 to S4 of the first semiconductor integrated circuit 101.

In other words, in all of the embodiments of the present embodiments, the semiconductor integrated circuit 100 and the external LSI having the connection relationship with the semiconductor integrated circuit 100 can send signals bi-directionally, if necessary. In this case, it is also possible for the semiconductor integrated circuit 100 to reduce the number of element electrodes required, in comparison with the conventional art.

As explained above, the main purpose of the present invention is to provide a semiconductor integrated circuit and the control method of the same, where the connection between a logic circuit unit and a semiconductor element electrode, both being installed within a package, can be changed according to an operating state of the logic circuit unit, thereby reducing the required number of semiconductor element electrodes. Thus, various changes can be made as long as they fall within the main purpose of the present invention.

The semiconductor integrated circuit related to the present invention can be employed in a semiconductor device, such as a cellular phone, possessing a various functions and requiring advanced integration and miniaturization, and its applicable fields.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor integrated circuit comprising:
a logic circuit unit;
a plurality of semiconductor element electrodes;
a signal selecting unit operable to select a signal line among a plurality of signal lines externally extending from said logic circuit unit and to electrically connect the selected signal line to a first semiconductor element electrode among said plurality of semiconductor element electrodes; and a signal control unit operable to control said signal selecting unit, wherein, in accordance with change of an operating state of said logic circuit unit, said signal selecting unit connects electrically the selected signal line to a second semiconductor element electrode among said plurality of semiconductor element electrodes, the second semiconductor element electrode being different from the first semiconductor element electrode;

wherein said signal control unit generates connection information relating to electrical connection of the plurality of signal lines to said plurality of semiconductor element electrodes, the electrical connection being made by said signal selecting unit in accordance with the change of the operating state of said logic circuit unit;

wherein said signal control unit sends the connection information to said signal selecting unit; and wherein said signal selecting unit retains new electrical connection based on the connection information until a predetermined retaining period terminates after receiving the connection information from said signal control unit.

2. The semiconductor integrated circuit as defined in claim 1, wherein said signal control unit sends the connection information to an external semiconductor integrated circuit as well.

3. The semiconductor integrated circuit as defined in claim 1, wherein said signal selecting unit maintains the second semiconductor element electrode at high impedance during the predetermined retaining period.

4. The semiconductor integrated circuit as defined in claim 2, wherein said signal selecting unit comprises:

a selector operable to make new electrical connection of one of the plurality of signal lines to one of said plurality of semiconductor element electrodes, based on the connection information;

a state change detecting unit operable to detect the change of the operation state of said logic circuit unit, based on the connection information;

a state transition protection unit operable to retain the new electrical connection to be made by said selector for a predetermined retaining period after the detection of the change of the operation state of said logic circuit unit by said state change detecting unit; and a counter unit operable to count the predetermined retaining period, wherein when said counter unit finishes counting the predetermined retaining period, said state transition protection unit removes the retention of the new electrical connection to be made by said selector.

5. The semiconductor integrated circuit as defined in claim 4, wherein said counter unit finishes counting the predetermined retaining period based on an internally preset reference value.

6. The semiconductor integrated circuit as defined in claim 4, wherein said signal selecting unit further comprises an acknowledgement receiving unit operable to receive an acknowledgement signal for the connection information from the external semiconductor integrated circuit to which said signal control unit sends the connection information, and wherein said counter unit finishes counting the predetermined retaining period based on the acknowledgement signal received by said acknowledgement receiving unit.

7. The semiconductor integrated circuit as defined in claim 4, wherein said state transition protection unit maintains the second semiconductor element electrode at high impedance during the predetermined retaining period.

8. An electronic device comprising:

a plurality of semiconductor integrated circuits connected mutually; and a board operable to mount said plurality of semiconductor integrated circuits thereon, wherein at least one of said plurality of semiconductor integrated circuits comprises:

a logic circuit unit;

a plurality of semiconductor element electrodes;

a signal selecting unit operable to select a signal line among a plurality of signal lines externally extending from said logic circuit unit and to electrically connect the selected signal line to a first semiconductor element electrode among said plurality of semiconductor element electrodes, the first semiconductor element electrode being selected in accordance with change of an operating state of said logic circuit unit; and a signal control unit operable to control said signal selecting unit and to generate connection information relating to the electrical connection made by said signal selecting unit, thereafter sending the connection information to the other semiconductor integrated circuits among said plurality of semiconductor integrated circuits, wherein, in accordance with the change of the operating state of said logic circuit unit, said signal selecting unit connects electrically the selected signal line to a second semiconductor element electrode among said plurality of semiconductor element electrodes, the second semiconductor element electrode being different from the first semiconductor element electrode.

9. The electronic device as defined in claim 8, wherein said signal selecting unit retains electrical connection of the selected signal line to the second semiconductor element electrode until a predetermined retaining period terminates after the change of the operating state of said logic circuit unit is detected.

10. The electronic device as defined in claim 9, wherein said signal selecting unit receives an acknowledgement signal acknowledging receipt of the connection information from an external semiconductor integrated circuit to which said signal control unit sends the connection information, thereby finishing counting the predetermined retaining period based on the received acknowledgement signal.

11. The electronic device as defined in claim 9, wherein said signal selecting unit finishes counting the predetermined retaining period based on an internally preset reference value.

12. The electronic device as defined in claim 8, wherein said signal selecting unit maintains the second semiconductor element electrode at high impedance for the predetermined retaining period.

13. A controlling method of a semiconductor integrated circuit including a logic circuit unit and a plurality of semiconductor element electrodes, the controlling method comprising:

selecting one of a plurality of signal lines externally extending from the logic circuit unit;

performing a first electrical connection of the selected signal line to a first semiconductor element electrode among the plurality of semiconductor element electrodes; and performing a second electrical connection of the selected signal line to a second semiconductor element electrode among the plurality of semiconductor element electrodes, in accordance with change of an operating state of the logic circuit unit, the second semiconductor element electrode being different from the first semiconductor element electrode;

wherein said performing the second electrical connection includes retaining the second electrical connection of the selected signal line to the second semiconductor element electrode until a predetermined retaining period terminates.

14. The controlling method of the semiconductor integrated circuit as defined in claim 13, the controlling method further comprising:

generating connection information relating to the first electrical connection and the second electrical connection;

controlling the electrical connection to be made by said performing the first electrical connection and said performing the second electrical connection, based on the generated connection information; and notifying an external semiconductor integrated circuit of the generated connection information.

15. The controlling method of the semiconductor integrated circuit as defined in claim 13, wherein said performing the second electrical connection includes maintaining the second semiconductor element electrode at high impedance during the predetermined retaining period.

* * * * *